United States Patent

Bartley

Patent Number: 5,895,230
Date of Patent: Apr. 20, 1999

[54] INTEGRATED CIRCUIT CHIP PACKAGE HAVING CONFIGURABLE CONTACTS AND METHOD FOR MAKING THE SAME

[75] Inventor: Gerald K. Bartley, Rochester, Minn.

[73] Assignee: International Business Machines Corporation, Armonk, N.Y.

[21] Appl. No.: 08/949,097

[22] Filed: Oct. 10, 1997

Related U.S. Application Data

[62] Division of application No. 08/594,201, Jan. 31, 1996, Pat. No. 5,763,947.

[51] Int. Cl.⁶ .......................... H01L 21/00; H01L 21/44; H01L 21/48; H01L 21/50

[52] U.S. Cl. ..................... 438/4; 438/110; 438/127; 438/612

[58] Field of Search .......................... 438/110, 612, 438/4, 127

[56] References Cited

U.S. PATENT DOCUMENTS 4,975,765  12/1990  Ackermann et al. .
5,066,831  11/1991  Spielberger et al. .
5,334,857  8/1994  Mennitt et al. .
5,489,551  2/1996  Castleberry .

*Primary Examiner*—John F. Niebling
*Assistant Examiner*—Josetta I. Jones
*Attorney, Agent, or Firm*—Brian F. Russell; Andrew J. Dillon

[57] ABSTRACT

An integrated circuit chip package having an electrical contact configurable for either signal or power/ground and a method for constructing the integrated circuit chip package are disclosed. The integrated circuit chip package includes a substrate for supporting an integrated circuit chip and a dedicated conductor for supplying voltage to the integrated circuit chip. A configurable contact is attached to a surface of the substrate. The integrated circuit chip package further includes a signal connection for electrically connecting a signal connector of an integrated circuit chip and the configurable contact. A removable connector electrically connects the configurable contact and the dedicated conductor, thereby enabling the configurable contact to be configured as either a signal or power/ground contact depending upon the absence or presence of the electrical connection between the configurable contact and the dedicated conductor provided by the removable connector.

7 Claims, 2 Drawing Sheets

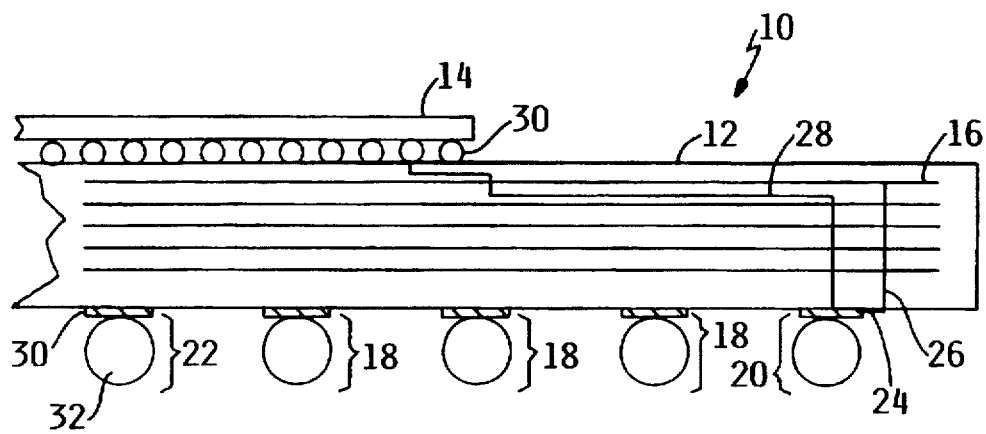
FIG. IA
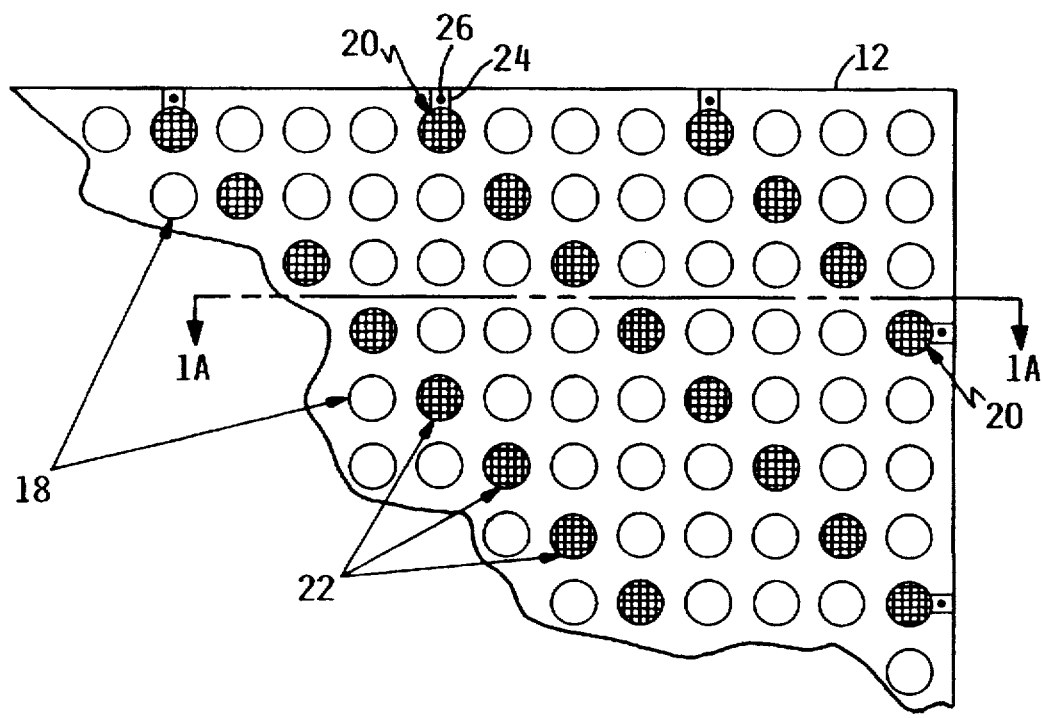
FIG. IB

INTEGRATED CIRCUIT CHIP PACKAGE HAVING CONFIGURABLE CONTACTS AND METHOD FOR MAKING THE SAME

This is a Division, of application Ser. No. 08/594,201, filed Jan. 31, 1996, now U.S. Pat. No. 5,763,947.

BACKGROUND OF THE INVENTION

1. Technical Field

The present invention relates in general to semiconductor devices and in particular to a semiconductor chip package and method for constructing a semiconductor chip package. Still more particularly, the present invention relates to a semiconductor chip package having one or more pads which can be configured as either signal, power, or ground and a method for making a semiconductor chip package having such configurable pads.

2. Description of the Related Art

Due to an ever-increasing demand for performance and miniaturization, semiconductor manufacturers are continually driven to produce smaller semiconductor devices. In order to reduce the size of semiconductor device packages, manufacturers have developed single and multichip modules (SCMs and MCMs) that efficiently house semiconductor chips having a large number of connections. A countervailing consideration in semiconductor device development is a desire to provide additional signal connections, particularly during the initial phases of product development and testing, in order to monitor or control the semiconductor chip. A larger substrate is often required to accommodate these additional signal connections. However, the cost of developing two different substrates—a larger substrate for use during development of a prototype semiconductor chip and a smaller substrate for use during production—is often greater than simply utilizing a larger substrate for both the development and production versions of the semiconductor device. Moreover, the two substrates may exhibit differing electrical characteristics, thereby making accurate prediction of the performance of the production substrate difficult.

One compromise between the conflicting design considerations described above is represented by Ackerman et al., U.S. Pat. No. 4,975,765, "Highly Integrated Circuit and Method for the Production Thereof." Ackerman et al. disclose a semiconductor chip attached to a substrate having an edge that projects beyond the semiconductor chip on all sides. Signal connections required for full dynamic testing of the semiconductor chip are provided within the projecting substrate edge. Following testing of the semiconductor chip, the projecting edge of the substrate is trimmed off, resulting in a smaller substrate and therefore a smaller device package. Although providing a smaller substrate, the semiconductor chip package disclosed by Ackerman et al. does not enable further debugging or testing to be performed following the removal of the additional signal connections. Such testing is often helpful in failure analysis of defective devices returned by customers. Additionally, the utilization of different substrate sizes during the development/testing and production of a semiconductor device often changes the noise and performance characteristics of the semiconductor device, making it difficult to extrapolate the results of device testing and debugging to production devices. Furthermore, although a semiconductor substrate like that disclosed by Ackerman et al. could be employed to build a smaller semiconductor device, the manufacturer (and consequently the customer) still incurs the cost of the discarded portion of the larger substrate.

As should thus be apparent, a substrate design for a semiconductor chip package is needed which provides the signal connections necessary for testing and failure analysis and which enables a smaller substrate to be utilized during both product development and production.

SUMMARY OF THE INVENTION

It is therefore one object of the present invention to provide an improved semiconductor device.

It is another object of the present invention to provide an improved semiconductor device package and method for making a semiconductor device package.

It is yet another object of the present invention to provide a semiconductor device package having pads configurable as either signal, power, or ground and a method for making a semiconductor device package with configurable pads.

The foregoing objects are achieved as is now described. An integrated circuit chip package having an electrical contact configurable for either signal or power/ground and a method for constructing the integrated circuit chip package are disclosed. The integrated circuit chip package includes a substrate for supporting an integrated circuit chip and a dedicated conductor for supplying voltage to the integrated circuit chip. A configurable contact is attached to a surface of the substrate. The integrated circuit chip package further includes a signal connection for electrically connecting a signal connector of an integrated circuit chip and the configurable contact. A removable connector electrically connects the configurable contact and the dedicated conductor, thereby enabling the configurable contact to be configured as either a signal or power/ground contact depending upon the absence or presence of the electrical connection between the configurable contact and the dedicated conductor provided by the removable connector.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 1A and 1B illustrate a cross-sectional and bottom plan view of a first preferred embodiment of a semiconductor chip package in accordance with the present invention.

DETAILED DESCRIPTION OF PREFERRED EMBODIMENT

Overview of First Preferred Embodiment

Figure 2A:
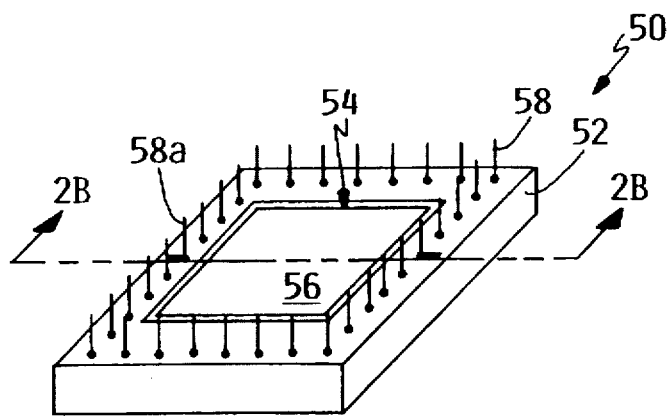
FIGS. 2A and 2B depict perspective and cross-sectional views of a second preferred embodiment of a semiconductor chip package in accordance with the present invention.

With reference now to the figures and in particular with reference to FIGS. 1A and 1B, there are illustrated a cross-sectional view and a bottom plan view of a semiconductor chip package having an electrical pad configurable as signal or power/ground in accordance with the present invention. The cross-sectional view depicted within FIG. 1A is taken along the line 1—1 illustrated within FIG. 1B. Referring first to FIG. 1A, module 10 comprises a substrate 12 upon which one or more of integrated circuit chip 14 are mounted. As will be appreciated by those skilled in the art, integrated circuit chip 14 comprises a silicon die within which 1 million or more components may be fabricated. To facilitate input and output of data and to supply power to integrated circuit chip 14, the lower (active) surface of integrated circuit chip 14 has numerous closely spaced chip connections 30 at locations corresponding to bond pads or other conductive metallizations on the top surface of substrate 12. Chip connections 30 typically have a size and spacing or "pitch" of approximately 5 mil (0.005 in.) diameters at 10 mil (0.010 in.) centers. However, the size and pitch of chip connections 30 could be increased, decreased, or irregular without detriment to the present invention. In the depicted embodiment, chip connections 30 comprise non-eutectic solder microballs which form a controlled, collapsible chip connection (C4); however, those skilled in the art will appreciate that, in the alternative, chip connections 30 can be formed by wire bond, tab attach, or other conventional attachment means. Moreover, although not illustrated within FIG. 1A, those skilled in the art will appreciate that integrated circuit chip 14 may be encapsulated by a thermoplastic or by a preformed aluminum, plastic, or ceramic cap to provide mechanical protection and/or thermal performance enhancement to integrated circuit chip 14 and chip connections 30.

Still referring to FIG. 1A, substrate 12 preferably comprises a suitable material such as ceramic, FR4 (a flame-retardant glass/epoxy), a cyanide ester compound, or the like. As is typical of conventional device substrates, substrate 12 is formed from multiple individual layers, some of which contain power planes 16, which each supply power or ground to integrated circuit chip 14 through chip power vias (not illustrated) and selected chip connections 30. Substrate 12 further includes a number of electrical pads 18–22, which are external contacts utilized to electrically access integrated circuit chip 14 and supply power to power planes 16. Thus, input/output (I/O) pads 18 supply control signals to and receive output signals from integrated circuit chip 14, while power pads 22 supply power or ground to power planes 16 within substrate 12. In accordance with the present invention, and as described in detail below, substrate 12 includes configurable pads 20, which can each be configured either as an I/O pad for use during testing, debugging and failure analysis or a power pad utilized during normal operation. In the depicted embodiment, each of electrical pads 18–22 is comprised of a conductive solder pad 34 formed on the bottom surface of substrate 12 and a solder ball 32 metallurgically bonded to its solder pad 34.

As illustrated within FIG. 1A, each configurable pad 20 is electrically connected by a removable connection 24 located on the lower surface of substrate 12 to a power via 26, which is in turn electrically connected to one or more of power planes 16 within substrate 12. Removable connection 24 preferably comprises a metallization that can be easily removed by grinding, scraping, laser cutting or other technique to disconnect power via 26 and configurable pad 20. Configurable pad 20 is also electrically connected to an I/O chip connection 30 of integrated circuit chip 14 through signal path 28. Thus, in accordance with an important aspect of the present invention, substrate 12 is manufactured such that each configurable pad 20 is electrically connected both to at least one power plane to supply power or ground thereto and an I/O chip connection 30 of integrated circuit chip 14.

Referring now to FIG. 1B, electrical pads 18–22 are preferably arranged in a ball grid array (BGA), with configurable pads 20 distributed at intervals along the edge of substrate 12. Locating configurable pads 20 along the edge of substrate 12 is advantageous since edge connections within BGAs are typically less reliable due to the disparate expansion coefficients of the material utilized to form substrate 12 and the circuit card to which electrical pads 18–22 are attached. Thus, if a configurable pad 20 fails due to cracking or the like, normal operation of integrated circuit chip 14 is not impeded since substrate 12 is typically constructed such that multiple other power pads 22 supply power to the power planes 16 to which the power via 26 associated with the failed configurable pad 20 is connected. Furthermore, the chip connection 30 to which the failed configurable pad 20 is electrically connected remains electrically connected to the appropriate power plane 16, further insuring the reliability of semiconductor chip 14.

In the depicted embodiment, electrical pads 18–22 could have a 30 mil (0.030 in.) diameter and may be located at 50 mil (0.050 in.) centers. Those skilled in the art appreciate that electrical pads 18–22 correspond in position to conductive pads or terminals formed on a printed circuit card or other user substrate to which substrate 12 is to be attached. To affix substrate 12 to an underlying user substrate, electrical pads 18–22 are first aligned with the pads or terminals on the user substrate. Thereafter, solder balls 32 are reflowed and bonded to the pads or terminals. In other embodiments of the present invention, substrate 12 could be attached to a circuit card or other user substrate by a Land Grid Array (LGA) in which pressure contacts mounted on the underside of substrate 12 in lieu of solder balls 32 mate with socket structures on the user substrate.

Construction

A semiconductor chip package embodying the present invention may be constructed utilizing substantially conventional techniques. To construct the first preferred embodiment depicted within FIGS. 1A and 1B, the multiple layers of a ceramic carrier are first defined. For example, the ceramic carrier may be comprised of twenty of more individually formed layers, which each contain particular features, such as power planes 16. The features within each layer, including traces, vias, and power planes, can be formed using conventional methods, for example, screen printing, punching, drilling, plating, lithography, and etching. The multiple layers comprising the carrier are then typically stacked within an alignment fixture and fired or cured to bond the layers together. Next, the carrier is excised to provide a substrate 12 having the proper size. Integrated circuit chip 14 is then attached to substrate 12 utilizing a controlled, collapsible chip connection (C4), wire bond, tab attach, or other suitable attachment technique. Next, a preformed solder ball 32 is positioned on each solder pad 34 and reflowed to construct electrical pads 18–22 on the underside of substrate 12. Thereafter, integrated circuit chip 14 (as well as other integrated circuit chips attached to substrate 12) may be encapsulated if additional mechanical protection or thermal enhancement is desired.

Operation

According to the present invention, during normal operation of integrated circuit chip 14, each configurable pad 20 functions as a power input to supply power or ground to selected power planes 16. In addition, as described above, each configurable pad 20 is electrically connected to an I/O chip connection 30, thereby effectively connecting the I/O chip connection 30 to either power or ground. The I/O chip connection 30 is preferably tied to a power plane 16 that drives the I/O chip connection 30 to an inactive (high impedance) state in order to avoid unnecessary power dissipation. This is particularly important when I/O chip connection 30 is a control input of integrated circuit chip 14 in order to prevent inadvertent operation of integrated circuit chip 14.

In order to provide an additional I/O pad for use during testing, debugging, or failure analysis of integrated circuit chip 14, a configurable pad 20 can be configured for I/O simply by removing a portion of the removable connection 24 between the configurable pad 20 and power via 26. By removing a portion of removable connection 24, configurable pad 20 is disconnected from power or ground. Thereafter, configurable pad 20 may be utilized as a normal I/O pad to supply control signals to integrated circuit chip 14 or receive output from integrated circuit chip 14 through signal path 28. When removable connection 24 is severed, power via 26 advantageously provides shielding to the parallel vias within the region of substrate 12. Following the completion of the testing of integrated circuit chip 14, removable connection 24 can be reestablished utilizing a reflowable solder paste. Alternatively, removable connection 24 can remain severed during production usage if signal noise and other operating criteria permit. Thus, the present invention enables one substrate size to be utilized both during testing and during production, thereby ensuring that performance characteristics of integrated circuit chip 14 do not vary beyond an acceptable amount between testing and actual operation.

Figure 2B:
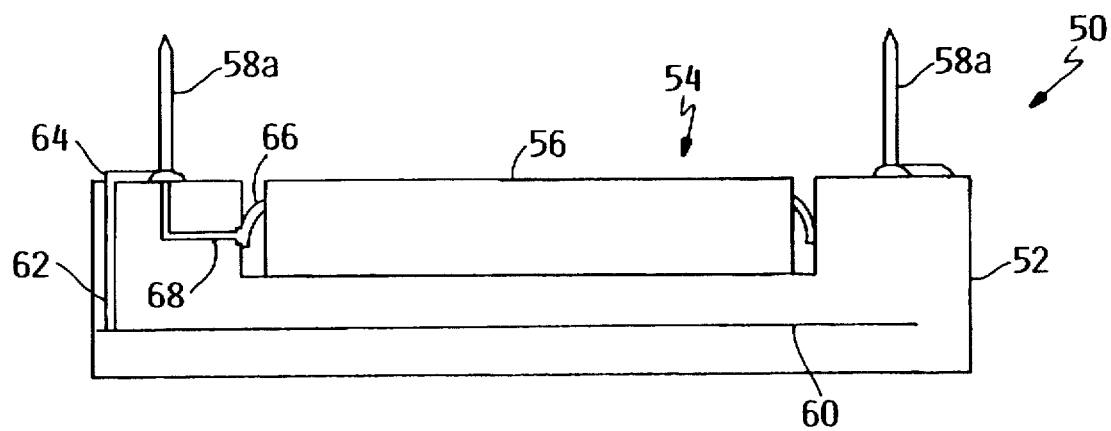

Although the present invention has been described with reference to a first preferred embodiment which comprises a BGA package, those skilled in the art will appreciate that numerous other package types, including plastic BGA, quad flat pack (QFP), or other suitable package types may be employed. With reference now to FIGS. 2A and 2B, there is illustrated a second preferred embodiment of the present invention which comprises a cavity-down pin grid array (PGA) package.

Overview of Second Preferred Embodiment

As illustrated, PGA package 50 includes substrate 52, which is preferably a conventional multilayer ceramic package. Package substrate 52 has a cavity 54 for housing integrated circuit chip 56. PGA package 50 further includes numerous pins 58, which enable through-hole attachment of PGA package 50 to a printed circuit board or other user substrate. Pins 58 preferably comprise gold-plated copper or other low resistance metal conductors. Like electrical pads 18-22 depicted within FIGS. 1A and 1B, pins 58 are utilized to electrically access integrated circuit chip 56.

Referring now to FIG. 2B, there is depicted a cross-sectional view of PGA package 50 taken along the line 2—2 of FIG. 2A. As depicted, substrate 52 includes one or more layers containing a power plane 60 for supplying power or ground to integrated circuit chip 56. Power plane 60 is electrically coupled to configurable pin 58A by power via 62 and removable connection 64. According to the present invention, configurable pin 58A is further connected to a signal connection 66 of integrated circuit chip 56 by a signal via 68. Consequently, the second preferred embodiment of the present invention illustrated within FIGS. 2A and 2B functions like the first preferred embodiment of the present invention depicted within FIGS. 1A and 1B. That is, during normal operation, power or ground is applied to configurable pin 58a, which conducts power or ground to power plane 60 within substrate 52 and signal connection 66 of integrated circuit chip 54. In order to prevent unnecessary power dissipation and inadvertent operation of integrated circuit chip 56, the polarity of the power or ground applied to configurable pin 58a is selected to drive signal connection 66 to the appropriate high-impedance level. During testing, debugging, or failure analysis, configurable pin 58a can be configured as a I/O pin simply by removing a portion of removable connection 64, thereby disconnecting configurable pin 58a from power plane 60.

As has been described, the present invention provides an improved integrated circuit chip package that includes one or more electrical contacts configurable as either signal or power/ground on a production-sized substrate. Although the present invention has been described and illustrated with reference to specific embodiments, it is not intended that the invention be limited to the illustrated embodiments. For example, the present invention is not limited to embodiments constructed utilizing the materials specifically described and illustrated herein. In addition, the present invention is applicable to numerous packaging types, including single chip modules (SCMs), multichip modules (MCMs), BGA, PGA, plastic BGA, enhanced QFP with predefined power and ground structures, and the like. It is also important to realize that the removable connection between the configurable pad and the dedicated power or ground conductor may be formed on a top surface, bottom surface, or along the periphery of a package substrate. Furthermore, to promote maximum design flexibility, an integrated circuit chip package embodying the present invention can be constructed with a configurable pad electrically connected by a first removable connector to a power via and electrically connected to a ground via by a second removable connector. A selected one of the first and second removable connectors would then be severed for normal operation of the integrated circuit.

While the invention has been particularly shown and described with reference to a preferred embodiment, it will be understood by those skilled in the art that various changes in form and detail may be made therein without departing from the spirit and scope of the invention.

What is claimed is:

1. A method for constructing an integrated circuit chip package, said method comprising:

providing a substrate for supporting an integrated circuit chip, said substrate having a dedicated conductor associated therewith for supplying voltage to said integrated circuit chip;

forming a configurable contact attached to a surface of said substrate;

forming a signal connection for electrically connecting at least one signal connector of said integrated circuit chip and said configurable contact; and forming a removable connector electrically coupling said configurable contact and said dedicated conductor, wherein said configurable contact can be configured for signal by removing said removable connector.

2. The method for constructing an integrated circuit chip package of claim 1, wherein said dedicated conductor is formed within said substrate, said method further comprising:

forming a conductive via electrically connected to said dedicated conductor within said substrate and said removable connector.

3. The method for constructing an integrated circuit chip package of claim 1, and further comprising:

removing at least a portion of said removable connector, such that said electrical connection between said configurable contact and said dedicated conductor is broken.

4. The method for constructing an integrated circuit chip package of claim 3, and further comprising:

thereafter, reestablishing said electrical connection between said configurable contact and said dedicated conductor.

5. The method for constructing an integrated circuit chip package of claim 4, wherein said step of thereafter reestablishing said electrical connection comprises electrically connecting said configurable contact and said dedicated conductor utilizing an electrically conductive solder paste.

6. The method for constructing an integrated circuit chip package of claim 1, and further comprising attaching at least one signal connector of said integrated circuit chip to said signal connection.

7. The method for constructing an integrated circuit chip package of claim 6, and further comprising encapsulating said integrated circuit chip and a portion of said surface of said substrate with an insulative material.

* * * * *